United States Patent
Kanai et al.

(10) Patent No.: US 10,449,862 B2
(45) Date of Patent: Oct. 22, 2019

(54) BATTERY MANAGING DEVICE, BATTERY MONITORING CIRCUIT, AND CONTROL SYSTEM

(71) Applicant: HITACHI AUTOMOTIVE SYSTEMS, LTD., Hitachinaka-shi, Ibaraki (JP)

(72) Inventors: Tomonori Kanai, Hitachinaka (JP); Akihiko Kudo, Hitachinaka (JP); Tomoyuki Arima, Hitachinaka (JP); Akiko Tsukamoto, Hitachinaka (JP)

(73) Assignee: HITACHI AUTOMOTIVE SYSTEMS, LTD., Hitachinaka-Shi, Ibaraki (JP)

( * ) Notice: Subject to any disclaimer, the term of this patent is extended or adjusted under 35 U.S.C. 154(b) by 1 day.

(21) Appl. No.: 15/555,485

(22) PCT Filed: Mar. 4, 2016

(86) PCT No.: PCT/JP2016/056697
§ 371 (c)(1),
(2) Date: Sep. 1, 2017

(87) PCT Pub. No.: WO2016/143678
PCT Pub. Date: Sep. 15, 2016

(65) Prior Publication Data
US 2018/0043781 A1    Feb. 15, 2018

(30) Foreign Application Priority Data
Mar. 11, 2015 (JP) ................................. 2015-048797

(51) Int. Cl.
*B60L 3/04* (2006.01)
*G01R 31/396* (2019.01)
(Continued)

(52) U.S. Cl.
CPC .................. *B60L 3/04* (2013.01); *B60L 9/18* (2013.01); *B60L 15/007* (2013.01); *B60L 58/10* (2019.02);
(Continued)

(58) Field of Classification Search
CPC .. B60L 3/04; B60L 9/18; G01R 31/00; G01R 31/36; G01R 19/00; G01R 35/00; H01M 10/48; H02J 7/00
(Continued)

(56) References Cited

U.S. PATENT DOCUMENTS 9,494,654 B2 * 11/2016 Kiuchi ............... G01R 31/3624
9,500,712 B2 * 11/2016 Tanaka ............... G01R 31/3606
(Continued)

FOREIGN PATENT DOCUMENTS

| EP | 2843432 A1 | 3/2015 |
|---|---|---|
| JP | H03-036935 A | 2/1991 |

(Continued)

OTHER PUBLICATIONS

International Search Report with English translation and Written Opinion issued in corresponding application No. PCT/JP2016/056697 dated Jun. 21, 2016.
(Continued)

*Primary Examiner* — Kawing Chan
(74) *Attorney, Agent, or Firm* — Foley & Lardner LLP

(57) ABSTRACT

Cell voltage measurement is executed immediately after termination of diagnosis on a cell voltage detection function. In a battery managing device 10, a voltage detecting unit 140 detects a terminal voltage of each of battery cells 21 and 22. An RC filter 110 is electrically connected to voltage detecting lines L1, L2, and L3, and a status variation causing unit 130 causes an electrical status variation with respect to the voltage detecting lines L1, L2, and L3. A voltage fluctuating (Continued)

unit 120 fluctuates the terminal voltage of the battery cells 21 and 22 in response to the electrical status variation that is caused by the status variation causing unit 130. A microcomputer 150 diagnoses the voltage detecting unit 140 on the basis of a detection result of the terminal voltage of the battery cells 21 and 22 by the voltage detecting unit 140 when the terminal voltage of the battery cells 21 and 22 is fluctuated by the voltage fluctuating unit 120.

8 Claims, 10 Drawing Sheets

(51) Int. Cl.
| | |
|---|---|
| *B60L 9/18* | (2006.01) |
| *G01R 31/36* | (2019.01) |
| *G01R 35/00* | (2006.01) |
| *G01R 19/00* | (2006.01) |
| *G01R 31/00* | (2006.01) |
| *H01M 10/48* | (2006.01) |
| *H02J 7/00* | (2006.01) |
| *B60L 15/00* | (2006.01) |
| *B60L 58/10* | (2019.01) |
| *G01R 31/3835* | (2019.01) |
| *B60L 50/51* | (2019.01) |

(52) U.S. Cl.
CPC ............ *G01R 19/00* (2013.01); *G01R 31/00* (2013.01); *G01R 31/36* (2013.01); *G01R 31/3835* (2019.01); *G01R 31/396* (2019.01); *G01R 35/00* (2013.01); *H01M 10/48* (2013.01); *H02J 7/00* (2013.01); *H02J 7/0047* (2013.01); *B60L 50/51* (2019.02); *B60L 2210/10* (2013.01); *B60L 2210/42* (2013.01); *B60L 2240/42* (2013.01); *B60L 2240/526* (2013.01); *Y02T 10/7005* (2013.01)

(58) Field of Classification Search
USPC ......................................................... 318/139
See application file for complete search history.

(56) References Cited

U.S. PATENT DOCUMENTS

| | | | | |
|---|---|---|---|---|
| 9,746,525 | B2* | 8/2017 | Kudo | B60L 3/0046 |
| 9,837,837 | B2* | 12/2017 | Wang | H02H 7/18 |
| 2008/0048619 | A1 | 2/2008 | Yoshida | |
| 2010/0244847 | A1 | 9/2010 | Kudo et al. | |
| 2012/0091964 | A1* | 4/2012 | Vance | B60L 3/0046 320/122 |
| 2012/0146652 | A1* | 6/2012 | Aoki | G01R 31/3658 324/433 |
| 2012/0212871 | A1 | 8/2012 | Taniguchi | |
| 2013/0113493 | A1* | 5/2013 | Kanno | H01M 10/48 324/426 |
| 2014/0021925 | A1* | 1/2014 | Asakura | B60L 3/0046 320/126 |
| 2014/0327400 | A1 | 11/2014 | Kudo et al. | |
| 2018/0196105 | A1* | 7/2018 | Inukai | G01R 31/36 |

FOREIGN PATENT DOCUMENTS

| | | | |
|---|---|---|---|
| JP | 2000-135000 A | | 5/2000 |
| JP | 2000-357541 A | | 12/2000 |
| JP | 2008-043188 A | | 2/2008 |
| JP | 2010-249793 A | | 11/2010 |
| JP | 2010-273447 A | | 12/2010 |
| JP | 2012-172992 A | | 9/2012 |
| JP | 2014-163921 A | | 9/2014 |
| JP | 2014219277 A | * | 11/2014 |
| WO | WO-2015/011801 A1 | | 1/2015 |

OTHER PUBLICATIONS

Extended European Search Report issued in corresponding European application 16761648.1 dated Mar. 11, 2019.
Office Action dated Oct. 23, 2018 in the corresponding Japanese application No. 2017-505290 with its English translation.

* cited by examiner

BATTERY MANAGING DEVICE, BATTERY MONITORING CIRCUIT, AND CONTROL SYSTEM

TECHNICAL FIELD

The present invention relates to a battery managing device, a battery monitoring circuit, and a control system.

BACKGROUND ART

In a hybrid electric vehicle (HEV), an electric vehicle (EV), and the like, an assembled battery (battery system), which is constituted by connecting a plurality of battery cells of a second battery in series, has been typically used so as to secure a desired high voltage. In the related art, a battery managing device using an integrated circuit and the like is connected to the assembled battery for every predetermined number of battery cells for capacity calculation of each of the battery cells or protection management. A charged and discharged status of the battery cell is controlled by the battery managing device to perform management of the battery cell.

Particularly, in the case of an assembled battery using a lithium ion battery in a battery cell, the lithium ion battery has a high energy density. Accordingly, it is dangerous to enter an over-charged status due to an abnormal operation of the battery managing device. Therefore, to enhance reliability and stability of the battery managing device, a technology of PTL 1 is known. PTL 1 discloses a configuration in which pseudo-voltage information is input to a battery status detection circuit that detects a battery status of the battery cell to diagnose whether or not the battery status detection circuit normally operates.

CITATION LIST

Patent Literature

PTL 1: Japanese Unexamined Patent Application Publication No. 2010-249793

SUMMARY OF INVENTION

Technical Problem

Generally, an RC filter, which is a nose filter for removal of noise, is connected to a voltage detecting line that is connected between the battery cell and the battery managing device. According to this, when performing diagnosis on a cell voltage detection function by inputting the pseudo-voltage information to the battery managing device similar to the technology described in PTL 1, there is necessity for waiting time corresponding to a time constant of the RC filter until an input voltage matches a cell voltage after termination of input of the pseudo-voltage information. Accordingly, there is a problem that it is difficult to execute cell voltage measurement immediately after termination of diagnosis on the cell voltage detection function.

Solution to Problem

A battery managing device according to an aspect of the present invention includes: a voltage detecting unit that is electrically connected to both electrodes of a plurality of battery cells through voltage detecting lines, and detects a terminal voltage of each of the plurality of battery cells; a filter circuit that is electrically connected to the voltage detecting lines; a status variation causing unit that causes an electrical status variation with respect to the voltage detecting lines; a voltage fluctuating unit that is electrically connected to the voltage detecting lines between the filter circuit and the voltage detecting unit, and fluctuates the terminal voltage in response to the electrical status variation that is caused by the status variation causing unit; and a diagnosing unit that diagnoses the voltage detecting unit on the basis of a detection result of the terminal voltage by the voltage detecting unit when the terminal voltage is fluctuated by the voltage fluctuating unit.

A battery managing device according to another aspect of the present invention includes: a voltage detecting unit that is electrically connected to both electrodes of a plurality of battery cells through voltage detecting lines, and detects a terminal voltage of each of the plurality of battery cells; a filter circuit that is electrically connected to the voltage detecting lines; a status variation causing unit that causes an electrical status variation with respect to the voltage detecting lines; and a diagnosing unit that diagnoses the voltage detecting unit on the basis of a detection result of the terminal voltage by the voltage detecting unit when the status variation causing unit causes the electrical status variation, wherein the voltage detecting unit includes a first storage unit and a second storage unit which store the detection result of the terminal voltage.

A battery monitoring circuit according to the present invention includes: a voltage detecting unit that is electrically connected to both electrodes of a plurality of battery cells through voltage detecting lines to which a filter circuit is connected, and detects a terminal voltage of each of the plurality of battery cells; a status variation causing unit that causes an electrical status variation with respect to the voltage detecting lines; and a voltage fluctuating unit that is electrically connected to the voltage detecting lines between the filter circuit and the voltage detecting unit, and fluctuates the terminal voltage in response to the electrical status variation that is caused by the status variation causing unit.

A control system according to an aspect of the present invention includes: the battery managing device; a travel inverter that performs a drive control of a travel motor that allows a vehicle, on which the battery managing device is mounted, to travel by using power supplied from an assembled battery including the plurality of battery cells; and a vehicle control device that controls the travel inverter, wherein in a case where it is diagnosed that at least any one of the plurality of battery cells, or the voltage detecting unit is abnormal, the battery managing device outputs abnormality information related to the abnormality to the vehicle control device, the vehicle control device performs a control of limiting power supply from the assembled battery with respect to the travel inverter on the basis of the abnormality information, and in a case where the voltage detecting unit is abnormal in comparison to a case where at least one of the plurality battery cells is abnormal, in the control, the vehicle control device mitigates limitation to the power supply from the assembled battery.

A control system according to another aspect of the present invention includes: the battery managing device; and a control device that performs a control of an apparatus that uses power supplied from an assembled battery including the plurality of battery cells, wherein the control device outputs noise information, which relates to noise output from the apparatus to the assembled battery, to the battery managing device, and the battery managing device invalidates diagnosis on the voltage detecting unit by the diagnosing unit and/or detection of the terminal voltage by the voltage detecting unit on the basis of the noise information.

A control system according to still another aspect of the present invention includes: the battery managing device; and a control device that performs a control of an apparatus that uses power supplied from an assembled battery including the plurality of battery cells, wherein the control device estimates noise that is output from the apparatus to the assembled battery, and invalidates a diagnosis result of the voltage detecting unit and/or a detection result of the terminal voltage, which are output from the battery managing device, on the basis of the estimation result.

Advantageous Effects of Invention

According to the invention, it is possible to execute cell voltage measurement immediately after termination of diagnosis on a cell voltage detection function.

DESCRIPTION OF EMBODIMENTS

—First Embodiment—

Figure 1:
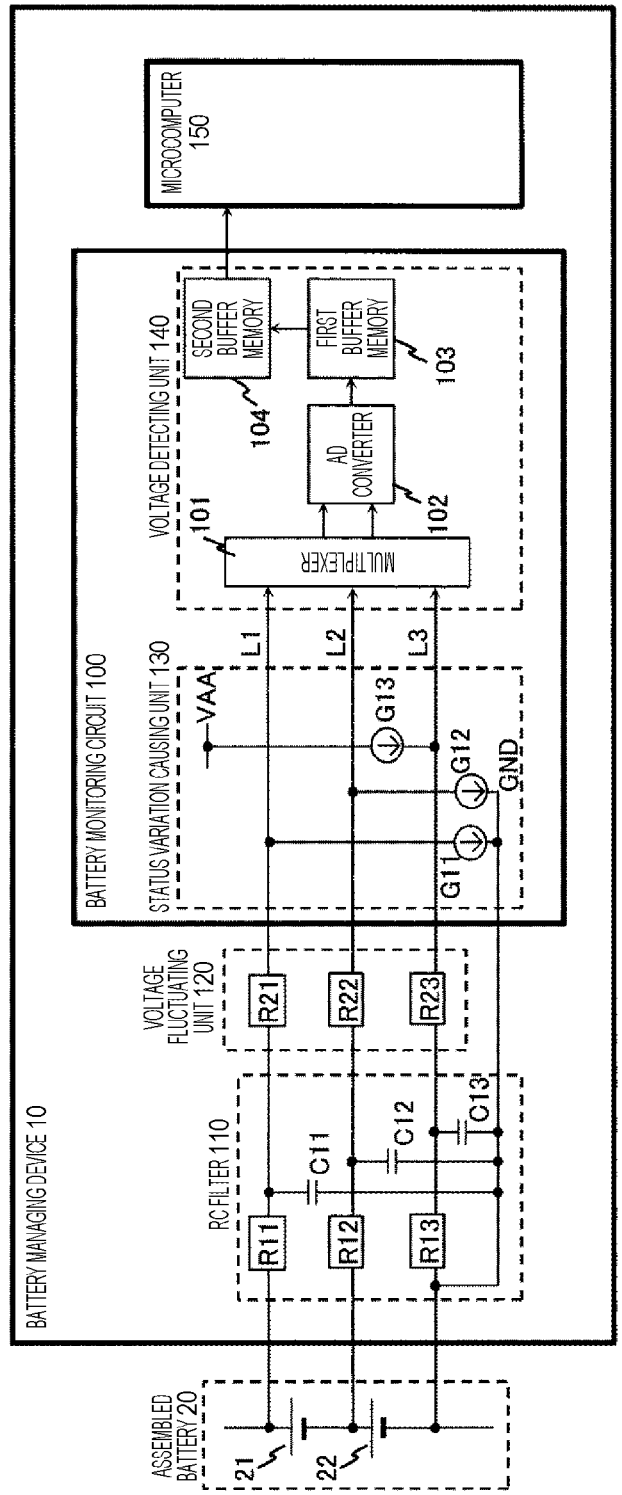
FIG. 1 is a view illustrating a configuration of a battery managing device according to a first embodiment of the invention.

FIG. 1 is a view illustrating a configuration of a battery managing device 10 according to a first embodiment of the invention. A battery managing device 10 manages battery cells 21 and 22 of an assembled battery 20, and includes a battery monitoring circuit 100, an RC filter 110, a voltage fluctuating unit 120, and a microcomputer 150. Furthermore, for simplification of description, FIG. 1 illustrates a configuration of the battery managing device 10 that manages an assembled battery 20 on the assumption that the assembled battery 20 includes two battery cells 21 and 22. However, the number of battery cells, which constitute the assembled battery 20, is not limited thereto. The assembled battery 20 may be constituted by an arbitrary number of battery cells, and the configuration of the battery managing device 10 may be determined in accordance with the number of the battery cells.

The battery monitoring circuit 100 includes a status variation causing unit 130 and a voltage detecting unit 140. The voltage detecting unit 140 is electrically connected to both electrodes of the battery cells 21 and 22 through voltage detecting lines L1, L2, and L3. The voltage detecting unit 140 includes a multiplexer 101, an AD converter 102, a first buffer memory 103, and a second buffer memory 104.

The multiplexer 101 selects any one of the battery cells and 22 as a terminal voltage measurement target in correspondence with an instruction of the microcomputer 150. In addition, the multiplexer 101 selects a pair of voltage detecting lines, which are connected to both electrodes of a battery cell that is set as the measurement target, among the voltage detecting lines L1, L2, and L3, and outputs each voltage to the AD converter 102. The AD converter 102 detects a potential difference between the pair of voltage detecting lines selected by the multiplexer 101 to detect a terminal voltage (cell voltage) of the battery cell that is the measurement target. In addition, the AD converter 102 converts a detection result of the terminal voltage from an analog value to a digital value, and outputs the converted detection result to the first buffer memory 103. The battery monitoring circuit 100 can detect the terminal voltage of each of the battery cells 21 and 22 by sequentially performing the above-described operation with respect to the battery cells 21 and 22.

The first buffer memory 103 is a storage device that temporarily stores a detection result of the terminal voltage that is output from the AD converter 102. The detection result of the terminal voltage, which is stored in the first buffer memory 103, is output to the second buffer memory 104 in response to an instruction of the microcomputer 150. The second buffer memory 104 is a storage device that temporarily stores the detection result of the terminal voltage which is output from the first buffer memory 103. The detection result of the terminal voltage, which is stored in the second buffer memory 104, is fetched to the microcomputer 150.

The microcomputer 150 monitors and manages the assembled battery 20 on the basis of the detection result of the terminal voltage which is fetched from the second buffer memory 104. For example, in a case where the terminal voltage indicates an abnormal value, the microcomputer 150 determines that the assembled battery 20 is abnormal, and outputs a signal indicating the determination result to a higher controller (not illustrated).

The RC filter 110 is configured to remove nose that is superimposed on the voltage detecting lines L1, L2, and L3, and is electrically connected to the voltage detecting lines L1, L2, and L3. The RC filter 110 includes a resistive elements R11, R12, and R13 which are respectively provided on the voltage detecting lines L1, L2, and L3, and a capacitive elements C11, C12, and C13 which are respectively provided between the voltage detecting lines L1, L2, and L3, and a grounding wire GND.

The status variation causing unit 130 is configured to cause an electrical status variation with respect to the voltage detecting lines L1, L2, and L3, and includes current source G11, G12, and G13. The current source G11, G12, and G13 are respectively connected to the voltage detecting lines L1, L2, and L3, and allows a predetermined current to flow through the voltage detecting lines L1, L2, and L3 so as to cause the electrical status variation. At this time, a current flows through the voltage detecting lines L1 and L2 from a left side to a right in the drawing, and a current flows through the voltage detecting line L3 from the right side to the left side in the drawing. Furthermore, ON and OFF of the current source G11, G12, and G13 can be individually controlled by the microcomputer 150.

The voltage fluctuating unit 120 is electrically connected to the voltage detecting lines L1, L2, and L3 between the RC filter 110 and the voltage detecting unit 140, and includes diagnosis resistors R21, R22, and R23. The diagnosis resistors R21, R22, and R23 are respectively provided on the voltage detecting lines L1, L2, and L3. When the current source G11, G12, and G13 of the status variation causing unit 130 allow a current to flow through the voltage detecting lines L1, L2, and L3, a terminal voltage at the time of energization, which is detected by the voltage detecting unit 140, varies from a terminal voltage at the time of non-energization due to voltage drop in the diagnosis resistors R21, R22, and R23. According to this, the voltage fluctuating unit 120 fluctuates the terminal voltage of each of the battery cells 21 and 22 in response to the electrical status variation that is caused by the status variation causing unit 130.

The terminal voltage, which is fluctuated by the voltage fluctuating unit 120 as described above, is selected by the multiplexer 101 and is detected by the AD converter 102 in the voltage detecting unit 140. In addition, the terminal voltage is stored in the first buffer memory 103 and the second buffer memory 104, and is fetched by the microcomputer 150. The microcomputer 150 diagnoses whether or not the voltage detecting unit 140 correctly detects the terminal voltage on the basis of the detection result of the terminal voltage that is fetched from the second buffer memory 104.

For example, when the battery cell 21 is set as a measurement target, when a current is allowed to flow from the current source G11 to the voltage detecting line L1, in a case where the voltage detecting unit 140 correctly measures the terminal voltage, a difference in a measurement value of the terminal voltage occurs in comparison to non-energization due to voltage drop in the diagnosis resistor R21 in. However, in a case where the voltage detecting unit 140 cannot correctly measure the terminal voltage of the battery cell 21 due to a reason such as erroneous section of a battery cell, which is not a measurement target, by the multiplexer 101, a difference in the measurement value of the terminal voltage does not occur between energization and non-energization. The microcomputer 150 can perform diagnosis on the terminal voltage measurement through the voltage detecting line L1 by the voltage detecting unit 140 by using the above-described phenomenon. In addition, the microcomputer 150 can also perform diagnosis on the terminal voltage measurement through the voltage detecting lines L2 and L3 by the same method. That is, it is possible to diagnose whether or not the terminal voltage measurement through the voltage detecting lines L2 and L3 by the voltage detecting unit 140 is normal by measuring the terminal voltage of battery cells 21 and 22 when allowing a current to flow through the voltage detecting lines L2 and L3 by using the current sources G12 and G13, and by investigating whether or not a measurement value varies in comparison to non-energization. In this manner, the microcomputer 150 can diagnose whether or not the voltage detecting unit 140 correctly measures the terminal voltage of the battery cells 21 and 22.

When performing the above-described diagnosis, the microcomputer 150 functions as a diagnosing unit that diagnoses the voltage detecting unit 140. As a result, in a case where it is determined that the voltage detecting unit 140 cannot correctly measure the terminal voltage, the microcomputer 150 outputs a signal, which indicates the determination result, to a higher controller (not illustrated).

As described above, the battery managing device 10 diagnoses the voltage detecting unit 140 by using a configuration in which the voltage fluctuating unit 120 fluctuates the terminal voltage of the battery cells 21 and 22 in response to the electrical status variation that is caused by the status variation causing unit 130. According to this, it is possible to rapidly perform the diagnosis on the voltage detecting unit 140 regardless of a time constant of the RC filter 110. This will be described below in detail.

Figure 2:
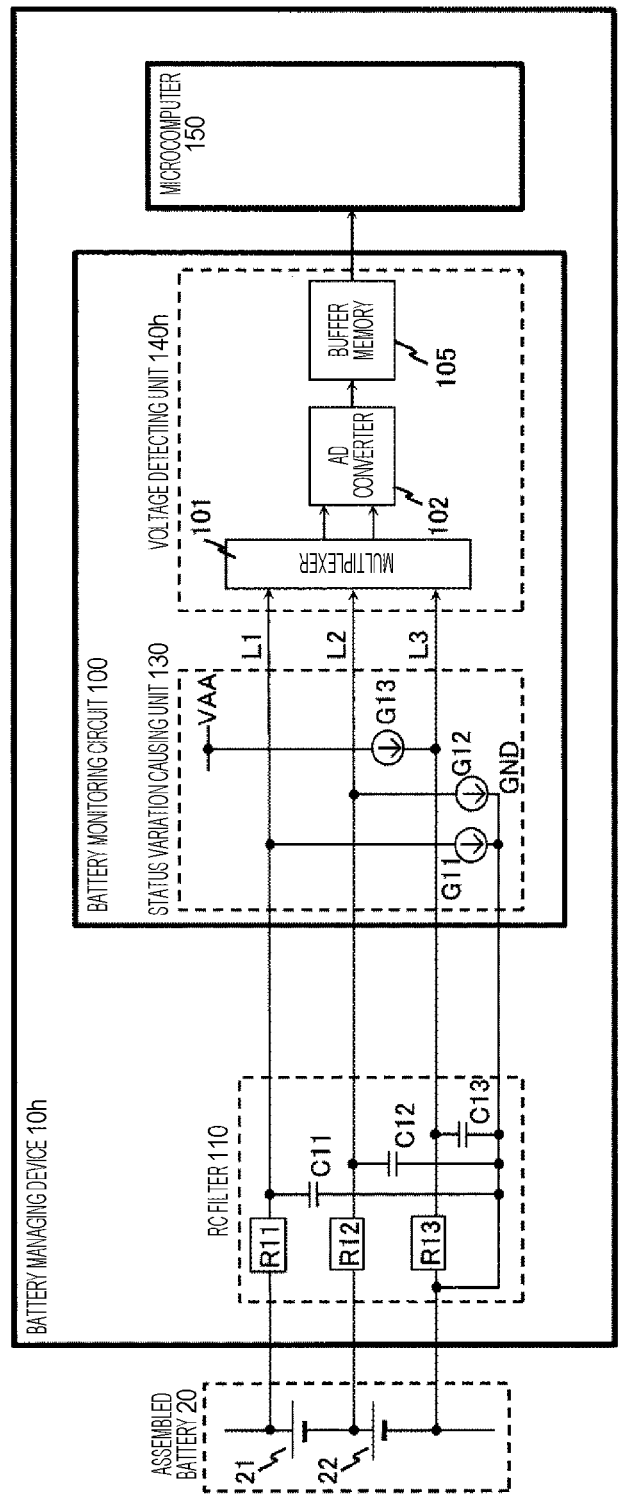
FIG. 2 is a view illustrating a configuration of a battery managing device as a comparative example.

FIG. 2 is a view illustrating a configuration of a battery managing device 10h as a comparative example. The battery managing device 10h has the same configuration as that of the battery managing device 10 illustrated in FIG. 1 except that the voltage fluctuating unit 120 is not provided, and a voltage detecting unit 140h is provided instead of the voltage detecting unit 140. In the voltage detecting unit 140h, one buffer memory 105 is provided instead of the first buffer memory 103 and the second buffer memory 104 in FIG. 1.

In the battery managing device 10h, when the current source G11, G12, and G13 of the status variation causing unit 130 allows a current to flow through the voltage detecting lines L1, L2, and L3, a terminal voltage, which is detected by the voltage detecting unit 140h, fluctuates at a rate corresponding to the time constant of the RC filter 110. As the case with the battery managing device 10, it is possible to diagnose whether or not the voltage detecting unit 140h correctly measures the terminal voltage by detecting the fluctuation in the terminal voltage.

Figure 3:
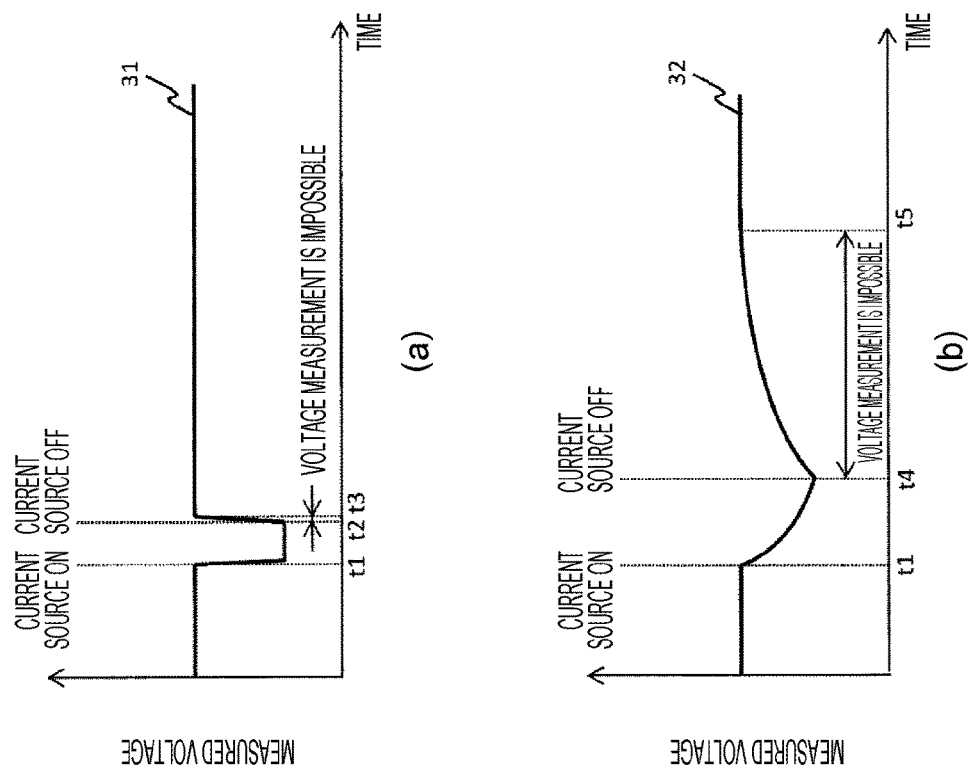
FIG. 3 is a view illustrating fluctuation patterns of terminal voltages which are respectively measured in the first embodiment of the invention and the comparative example.

FIG. 3 is a view illustrating fluctuation patterns of terminal voltages which are respectively measured in the first embodiment of the invention and the comparative example. FIG. 3(a) illustrates the terminal voltage that is measured by the battery managing device 10 according to the first embodiment of the invention as illustrated in FIG. 1, and FIG. 3(b) illustrates the terminal voltage that is measured by the battery managing device 10h according to the comparative example as illustrated in FIG. 2. Furthermore, FIGS. 3(a) and 3(b) respectively illustrate variation patterns of the terminal voltage of the battery cell 21 in the case of allowing a current to flow through the voltage detecting line L1 by using the current source G11 as an example. However, even in the case of allowing a current to flow through the voltage detecting line L2 or L3 by using another current source G12 or G13, the terminal voltage of the battery cell 22 varies in the same manner as illustrated in FIGS. 3(a) and 3(b).

In the case of the battery managing device 10, when a current is allowed to flow through the voltage detecting line L1 by the current source G11 at time t1, a measured voltage 31, which is obtained by measuring the terminal voltage by the voltage detecting unit 140, immediately varies due to voltage drop in the diagnosis resistor R21 as illustrated in FIG. 3(a). For example, when an output current value of the current source G11 is set to 50 μA and a resistance value of the diagnosis resistor R21 is set to 1 kΩ, a variation of 50 mV occurs in the measured voltage 31. Diagnosis on the voltage detecting unit 140 is performed by detecting the variation.

As described above, in the battery managing device 10, when a current is allowed to flow through the voltage detecting line L1, a measurement value of the terminal voltage immediately varies. According to this, it is possible to shorten time taken from turning-on of the current source G11 to measurement of the terminal voltage at the time of energization. At this time, a voltage of the voltage detecting line L1 between the RC filter 110 and the voltage fluctuating unit 120 varies from a value at the time of non-energization due to voltage drop at the resistive element R11. A rate of the voltage variation is determined in correspondence with a time constant that is determined by a resistance value of the resistive element R11 and a capacitance value of the capacitive element C11.

After measuring the terminal voltage at the time of energization, when the current source G11 is turned off at time t2 to stop flowing of the current, a voltage of the voltage detecting line L1 returns to a status before the time t1. At this time, a voltage variation, which occurs in a period from time t1 to time t2, is canceled at a variation rate determined in correspondence with the time constant, and thus the measured voltage 31 returns to the original voltage. When time at this time is set as t3, in a period from time t2 to time t3, it is impossible to obtain the measured voltage 31 indicating a correct terminal voltage. However, as described above, when shorting the time from turning-on of the current source G11 to measurement of the terminal voltage at the time of energization, it is possible to shorten the period from time t1 to time t2. Accordingly, it is possible to shorten a period in which measurement of the terminal voltage is impossible.

On the other hand, in the case of the battery managing device 10h, when a current is allowed to flow through the voltage detecting line L1 at time t1 by the current source G11, as illustrated in FIG. 3(b), a measured voltage 32, which is obtained by measuring the terminal voltage by the voltage detecting unit 140h, gradually varies. A variation rate of the measured voltage 32 is determined in correspondence with the time constant that is determined by the resistance value of the resistive element R11 and the capacitance value of the capacitive element C11 which constitute the RC filter 110. For example, the resistance value of the resistive element R11 is set to 10 kΩ and the capacitance value of the capacitive element C11 is set to 1 μF, the time constant becomes 10 ms.

In the battery managing device 10h, as described above, even when a current is allowed to flow through the voltage detecting line L1, the measurement value of the terminal voltage does not vary immediately, and varies at a rate corresponding to the time constant of the RC filter 110. According to this, time, which is longer in comparison to the case of the battery managing device 10, is necessary from turning-on of the current source G11 to measurement of the terminal voltage at the time of energization.

After measuring the terminal voltage at the time of energization, when the current source G11 is turned off at time t4 to stop flowing of the current, a voltage of the voltage detecting line L1 returns to a status before time t1. At this time, similar to the description with reference to FIG. 3(a), a voltage variation, which occurs in a period from time t1 to time t4, is canceled at a variation rate determined in correspondence with the time constant, and thus the measured voltage 32 returns to the original voltage. When time at this time is set as t5, in a period from time t4 to time t5, it is impossible to obtain the measured voltage 32 indicating a correct terminal voltage. In the battery managing device 10h, time, which is longer in comparison to the case of the battery managing device 10 as described above, is necessary from turning-on of the current source G11 to measurement of the terminal voltage at the time of energization. According to this, as illustrated in FIG. 3(b), a turned-on period of the current source G11 is further lengthened in comparison to the case of the battery managing device 10, and thus it can be seen that a period, in which measurement of the terminal voltage is impossible, is also lengthened.

Figure 4:
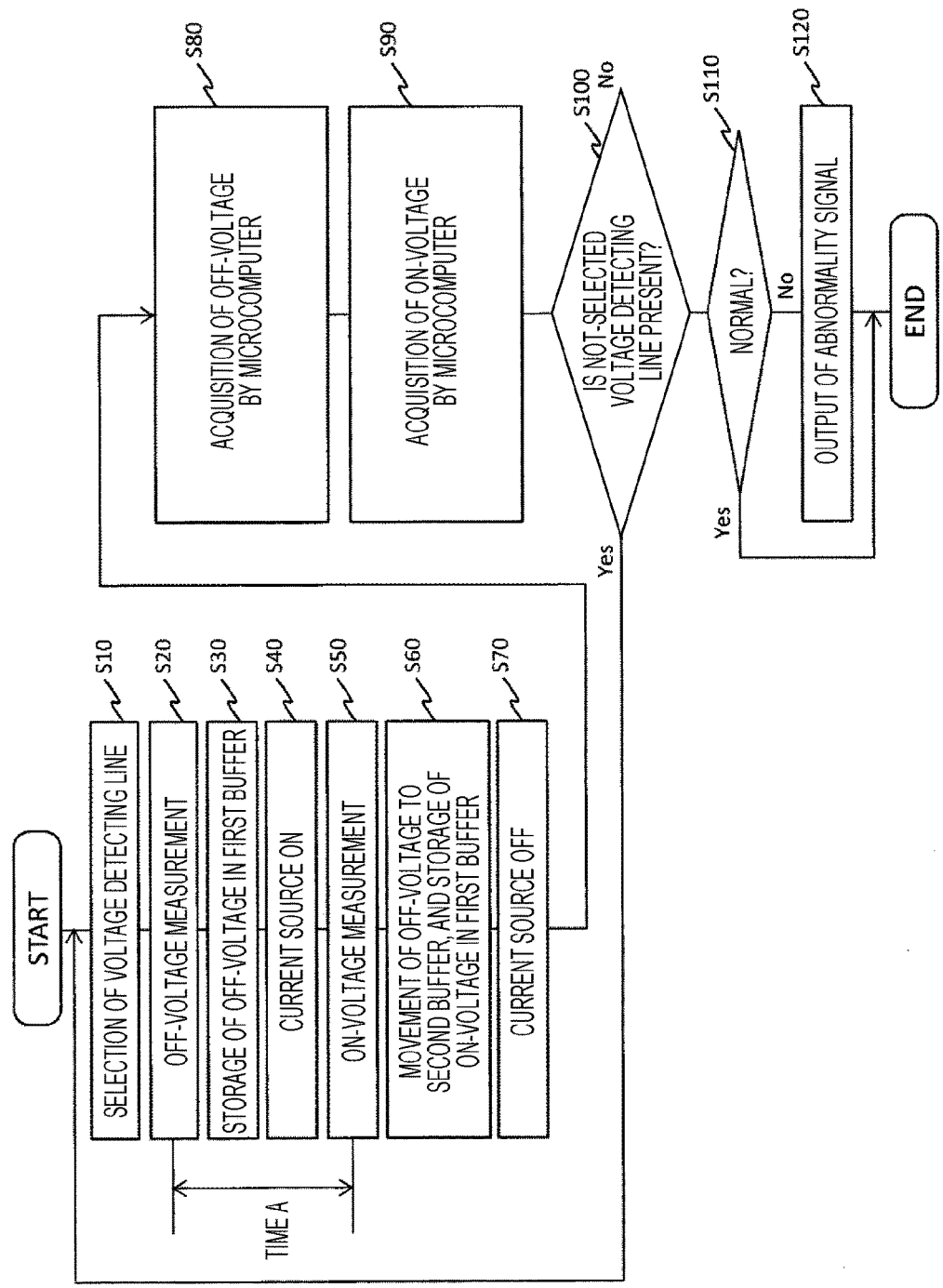
FIG. 4 is a flowchart of diagnosis processing that is executed in a battery managing device according to an embodiment of the invention.

Next, description will be given of processing when performing diagnosis on the voltage detecting unit 140 in the battery managing device 10. FIG. 4 is a flowchart of diagnosis processing on the voltage detecting unit 140 which is executed in the battery managing device 10 according to the embodiment of the invention. Furthermore, in FIG. 4, a reference of processing time necessary for execution of each processing step is indicated by a width in a vertical direction (height direction) of a box that indicates each processing step of step S10 to step S120.

In step S10, the battery managing device 10 selects any one among the voltage detecting lines L1, L2, and L3 by using the multiplexer 101 and the AD converter 102 of the voltage detecting unit 140. In step S20, the battery managing device 10 measures an OFF-voltage of the voltage detecting line selected in step S10, that is, the terminal voltage at the time of non-energization by using the AD converter 102 of the voltage detecting unit 140. In step S30, the battery managing device 10 stores the OFF-voltage measured in step S20 in the first buffer memory 103.

In step S40, the battery managing device 10 turns on a current source, which corresponds to the voltage detecting line selected in step S10, among the current source G11, G12, and G13 of the status variation causing unit 130, and allows a current to flow through the voltage detecting line that is selected. In step S50, the battery managing device 10 measures an ON-voltage of the voltage detecting line selected in step S10, that is, a terminal voltage at the time of energization by using the AD converter 102 of the voltage detecting unit 140. In step S60, the battery managing device 10 moves the OFF-voltage, which is stored in step S30, to the second buffer memory 104 from the first buffer memory 103, and stores the ON-voltage that is measured in step S50 in the first buffer memory 103. In step S70, the battery managing device 10 turns off the current source that is turned on in step S40 to stop flowing of the current.

In step S80, the battery managing device 10 acquires the OFF-voltage, which is stored in the second buffer memory 104, by the microcomputer 150. In the subsequent step S90, the battery managing device 10 moves the ON-voltage, which is stored in the first buffer memory 103, to the second buffer memory 104, and acquires the ON-voltage by the microcomputer 150.

In step S100, the battery managing device 10 determines whether or not a voltage detecting line that is not selected in step S10 is present. When the not-selected voltage detecting line is present, the processing returns to step S10. Any one voltage detecting line, which is not selected, is selected in step S10, and the above-described processing subsequent to step S20 is repeated. According to this, the ON-voltage and the OFF-voltage are measured with respect to each of the voltage detecting lines L1, L2, and L3, are respectively stored in the first buffer memory 103 and the second buffer memory 104, and are acquired by the microcomputer 150. In step S100, in the case where it is determined that the not-selected voltage detecting line is not present, that is, the ON-voltage and the OFF-voltage with respect to the entirety of the voltage detecting lines L1, L2, and L3 are completely acquired by the microcomputer 150, the processing proceeds to step S110.

In step S110, the battery managing device 10 determines whether or not the voltage detecting unit 140 is normal on the basis of the OFF-voltage (terminal voltage at the time of non-energization) and the ON-voltage (terminal voltage at the time of energization), which are acquired in steps S80 and S90 by the microcomputer 150, of each of the voltage detecting lines. Here, a difference between the OFF-voltage and the ON-voltage of each of the voltage detecting lines is obtained to obtain a voltage variation when the voltage fluctuating unit 120 fluctuates the terminal voltage in response to the electrical status variation that is caused by the status variation causing unit 130. In this manner, it is determined whether or not the voltage variation, which is obtained as described above, of the terminal voltage at each of the voltage detecting line is equal to or greater than a predetermined threshold value, and when the voltage variation is equal to or greater than the threshold value, the voltage detecting unit 140 is determined as normal. In this case, the battery managing device 10 terminates the diagnosis processing illustrated in the flowchart of FIG. 4. On the other hand, in a case where the voltage variation of the terminal voltage in any voltage detecting line is less than the threshold value, the voltage detecting unit 140 is determined as abnormal. In this case, the battery managing device 10 proceeds the processing to step S120.

Furthermore, the threshold value, which is determined in the determination in step S110, can be determined on the basis of a resistance value of the diagnosis resistors R21, R22, and R23 of the voltage fluctuating unit 120, and the magnitude of a current that is output to the current source G11, G12, and G13 of the status variation causing unit 130. That is, the threshold value, which is used in the determination in step S110, is determined on the basis of the magnitude of voltage drop, which is determined by the above-described values, in the diagnosis resistors R21, R22, and R23 at the time of energization.

In step S110, in a case where the voltage detecting unit 140 is determined as abnormal, in step S120, the battery managing device 10 outputs a predetermined abnormality signal by the microcomputer 150. Here, the abnormality signal, which indicates that the voltage detecting unit 140 cannot correctly measure the terminal voltage, is output from the microcomputer 150 to a higher controller (not illustrated). After executing step S120, the battery managing device 10 terminates the diagnosis processing illustrated in the flowchart of FIG. 4.

Furthermore, in the above-described flowchart of FIG. 4, when time taken from measurement of the OFF-voltage in step S20 to measurement of the ON-voltage in step S50 is set as A, the length of the time A is approximately the same as time illustrated in FIG. 4. This can be accomplished when considering that the battery managing device 10 includes two buffer memories (the first buffer memory 103 and the second buffer memory 104 as illustrated in FIG. 1, and thus it is possible to perform measurement of the ON-voltage before the previously measured OFF-voltage is fetched to the microcomputer 150. In contrast, in the battery managing device 10h of the comparative example illustrated in FIG. 2, only one buffer memory 105 is provided, and thus it is necessary to perform measurement of the ON-voltage after fetching a measurement result of the OFF-voltage to the microcomputer 150. That is, it is impossible to execute the processing in steps S40 and S50 if the processing in step S80 is not executed after step S30 in FIG. 4. According to this, time longer than the time A is apt to be taken.

According to the first embodiment to the invention as described above, the following operational effects are exhibited.

(1) The battery managing device 10 includes the battery monitoring circuit 100 including the status variation causing unit 130 and the voltage detecting unit 140, the RC filter 110, the voltage fluctuating unit 120, and the microcomputer 150. The voltage detecting unit 140 is electrically connected to both electrodes of the battery cells 21 and 22 through the voltage detecting lines L1, L2, and L3, and detects the terminal voltage of each of the battery cells 21 and 22. The RC filter 110 is electrically connected to the voltage detecting lines L1, L2, and L3, and the status variation causing unit 130 causes the electrical status variation with respect to the voltage detecting lines L1, L2, and L3. The voltage fluctuating unit 120 is electrically connected to the voltage detecting lines L1, L2, and L3 between the RC filter 110 and the voltage detecting unit 140, and fluctuates the terminal voltage of the battery cells 21 and 22 in response to the electrical status variation caused by the status variation causing unit 130. The microcomputer 150 diagnoses the voltage detecting unit 140 on the basis of a detection result of the terminal voltage of the battery cells 21 and 22 by the voltage detecting unit 140 when fluctuating the terminal voltage of the battery cells 21 and 22 by the voltage fluctuating unit 120. According to this configuration, in the battery managing device 10, it is possible to execute measurement of the cell voltage immediately after terminating of the diagnosis on the cell voltage detection function by the voltage detecting unit 140.

(2) The voltage fluctuating unit 120 includes the diagnosis resistors R21, R22, and R23. According to this, it is possible to easily and reliably fluctuate the terminal voltage of the battery cells 21 and 22 in response to the electrical status variation caused by the status variation causing unit 130 with respect to the voltage detecting lines L1, L2, and L3 with a simple configuration.

(3) The status variation causing unit 130 includes the current source G11, G12, and G13, and allows a current output from the current source G11, G12, and G13 to flow through the voltage detecting lines L1, L2, and L3 so as to cause the electrical status variation with respect to the voltage detecting lines L1, L2, and L3. According to this configuration, it is possible to easily and reliably cause the electrical status variation with respect to the voltage detecting lines L1, L2, and L3 with a simple configuration.

(4) In step S110, the microcomputer 150 diagnoses the voltage detecting unit 140 as abnormal in a case where a voltage variation in the detection result of the terminal voltage of the battery cells 21 and 22 is less than a predetermined threshold value when fluctuating the terminal voltage of the battery cells 21 and 22 by the voltage fluctuating unit 120. The threshold value is determined on the basis of the resistance value of the diagnosis resistors R21, R22, and R23 which constitute the voltage fluctuating unit 120, and the magnitude of the current that is output from the current source G11, G12, and G13 which constitute the status variation causing unit 130. According to this configuration, it is possible to reliably diagnose whether or not the voltage detecting unit 140 is abnormal.

(5) The voltage detecting unit 140 includes the first buffer memory 103 and the second buffer memory 104 which store the detection result of the terminal voltage of the battery cells 21 and 22. Specifically, the voltage detecting unit 140 stores the terminal voltage of the battery cells 21 and 22, which is obtained when the status variation causing unit 130 causes the electrical status variation with respect to the voltage detecting lines L1, L2, and L3, in the first buffer memory 103 as the ON-voltage of each of the voltage detecting lines (step S60). In addition, the voltage detecting unit 140 stores the terminal voltage of the battery cells 21 and 22, which is obtained when the status variation causing unit 130 does not cause the electrical status variation with respect to the voltage detecting lines L1, L2, and L3, in the second buffer memory 104 as the OFF-voltage of each of the voltage detecting lines (S30, S60). The microcomputer 150 fetches the ON-voltage and the OFF-voltage, which are stored in the first buffer memory 103 and the second buffer memory 104 as described above, from the voltage detecting unit 140 (step S80, S90), and diagnoses the voltage detecting unit 140 on the basis of the voltages which are fetched (step S110). According to the configuration, it is possible to perform diagnosis on the voltage detecting unit 140 by measuring the ON-voltage and the OFF-voltage of each of the voltage detecting lines in short time, and by fetching the ON-voltage and the OFF-voltage by the microcomputer 150.

—Second Embodiment—

Next, a second embodiment of the invention will be described. In the example described in the first embodiment, when a current is allowed to flow from the current source G11, G12, and G13 to the voltage detecting lines L1, L2, and L3, a charge migration occurs in the capacitive elements C11, C12, and C13 of the RC filter 110 due to voltage drop in the resistive elements R11, R12, and R13. According to this, as illustrated in FIG. 3(b), a period in which measurement of the terminal voltage is impossible is present although the period is short. In contrast, in the second embodiment, description will be given of an example in which the period in which measurement of the terminal voltage is impossible is set to approximately zero so that the charge migration in the capacitive elements C11, C12, and C13 of the RC filter 110 does not occur.

Figure 5:
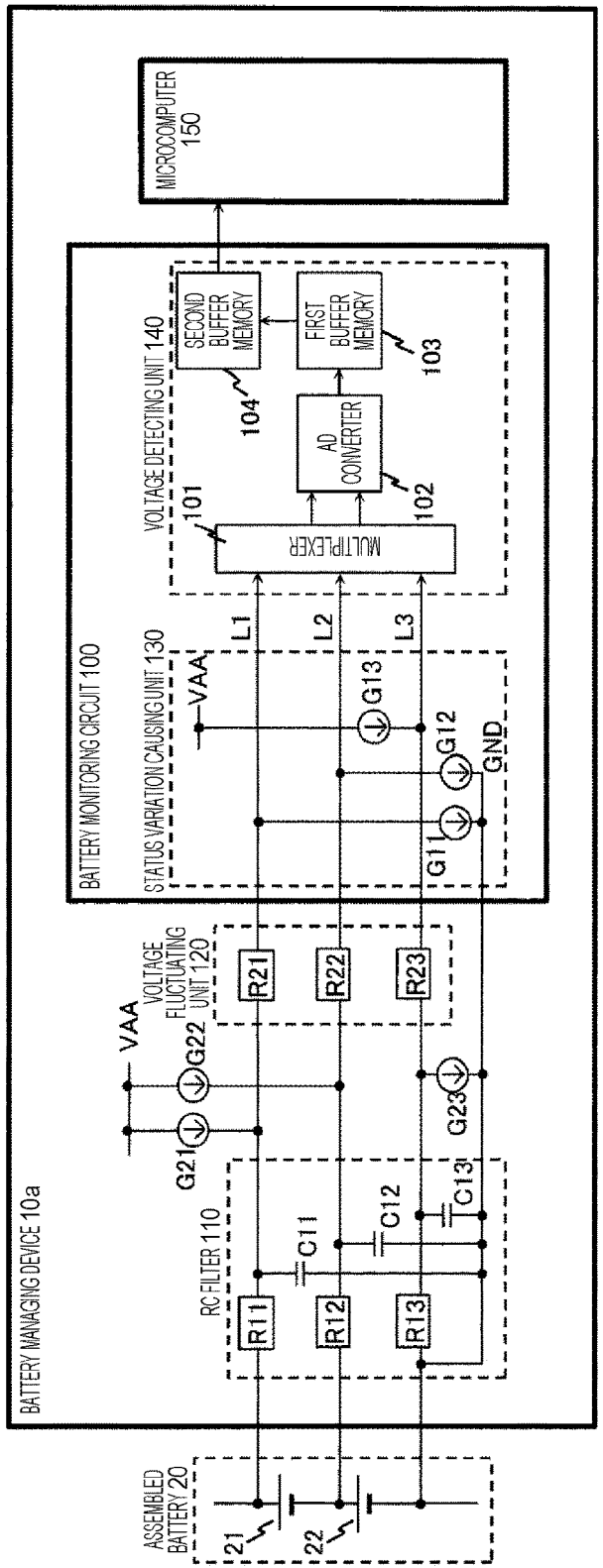
FIG. 5 is a view illustrating a configuration of a battery managing device according to a second embodiment of the invention.

FIG. 5 is a view illustrating a configuration of a battery managing device 10a according to the second embodiment of the invention. The battery managing device 10a of this embodiment is different from the battery managing device 10 described in the first embodiment in that current sources G21, G22, and G23 are additionally provided between the RC filter 110 and the voltage fluctuating unit 120. The current sources G21, G22, and G23 are respectively connected to the voltage detecting lines L1, L2, and L3, and allow a predetermined current to flow through the voltage detecting lines L1, L2, and L3 in cooperation with the current source G11, G12, and G13 of the status variation causing unit 130. According to this, as described in the first embodiment, the electrical status variation is caused with respect to the voltage detecting lines L1, L2, and L3. That is, the current sources G21, G22, and G23 cause the electrical status variation with respect to the voltage detecting lines L1, L2, and L3 in combination with the current source G11, G12, and G13.

As described above, in the battery managing device 10a, a current is allowed to flow from the current source G11, G12, and G13 and the current sources G21, G22, and G23 to the voltage detecting lines L1, L2, and L3. According to this, a current is allowed to flow to the diagnosis resistors R21, R22, and R23 of the voltage fluctuating unit 120 to cause voltage drop without allowing a current to flow to the RC filter 110. At this time, a charge migration does not occur in the capacitive elements C11, C12, and C13 of the RC filter 110. According to this, it is possible to set a period, in which measurement of the terminal voltage is impossible, to approximately zero.

Figure 6:
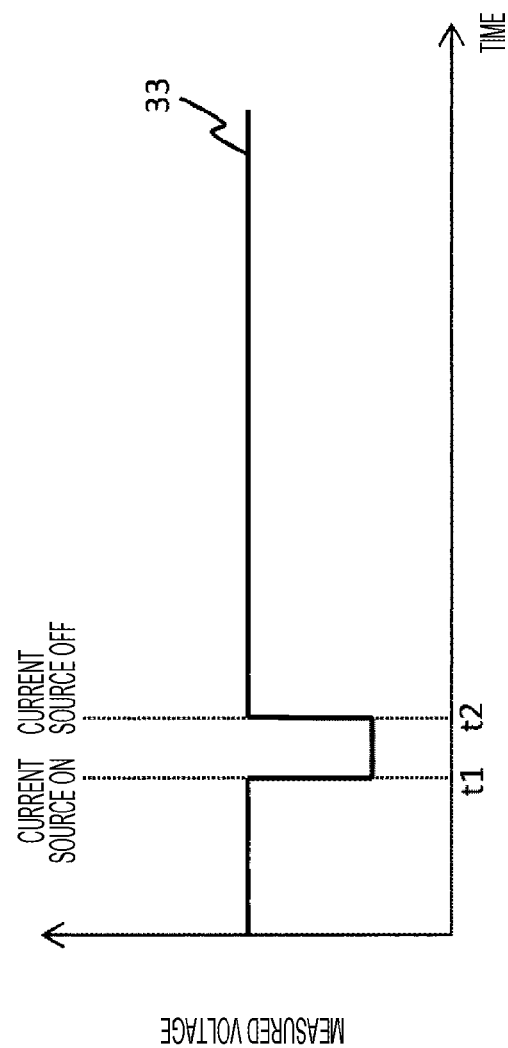
FIG. 6 is a view illustrating a fluctuation pattern of a terminal voltage that is measured in the second embodiment of the invention.

FIG. 6 is a view illustrating a fluctuation pattern of a terminal voltage that is measured in the second embodiment of the invention. Furthermore, FIG. 6 illustrates a variation pattern of the terminal voltage of the battery cell 21 in the case of allowing a current to flow through the voltage detecting line L1 by using the current sources G11 and G21 similar to FIG. 3 in the first embodiment as an example. However, even in the case of allowing a current to flow through the voltage detecting line L2 or L3 by using other current sources G12 and G22, or G13 and G23, the terminal voltage of the battery cell 22 varies similar to the pattern illustrated in FIG. 6.

In the case of the battery managing device 10a, when allowing a current to flow the voltage detecting line L1 by the current sources G11 and G21 at time t1, as illustrated in FIG. 6, a measured voltage 33, which is obtained by measuring the terminal voltage by the voltage detecting unit 140, immediately varies due to voltage drop in the diagnosis resistor R21. This configuration is the same as the configuration of the battery managing device 10 according to the first embodiment described with reference to FIG. 3(a). At this time, a current does not flow to the RC filter 110, and thus a voltage of the voltage detecting line L1 between the RC filter 110 and the voltage fluctuating unit 120 does not vary from a voltage at the time of non-energization.

After measuring the terminal voltage at the time of energization, when the current sources G11 and G21 are turned off at time t2 to stop flowing of the current, the voltage of the voltage detecting line L1 returns to a status before the time t1. At this time, as described above, the voltage of the voltage detecting line L1 does not varies even after the time t1, and thus the measured voltage 32 immediately returns to the original voltage as illustrated in FIG. 6. According to this, it is possible to shorten the period, in which measurement of the terminal voltage is impossible, as described in FIG. 3(a) to approximately zero.

According to the above-described second embodiment of the invention, the following operational effect is exhibited in addition to the operational effects described in the first embodiment. Specifically, the battery managing device 10a causes the electrical status variation with respect to the voltage detecting lines L1, L2, and L3 by using the current source G11, G12, and G13, and the current sources G21, G22, and G23 which are disposed on both ends of the diagnosis resistors R21, R22, and R23 which constitute the voltage fluctuating unit 120 to allow a current, which are output from the current sources, to flow through the voltage detecting lines L1, L2, and L3. According to this configuration, it is possible to provide a high-performance battery managing device capable of shorting the period in which measurement of the terminal voltage of the battery cells 21 and 22 is impossible.

—Third Embodiment—

Figure 7:
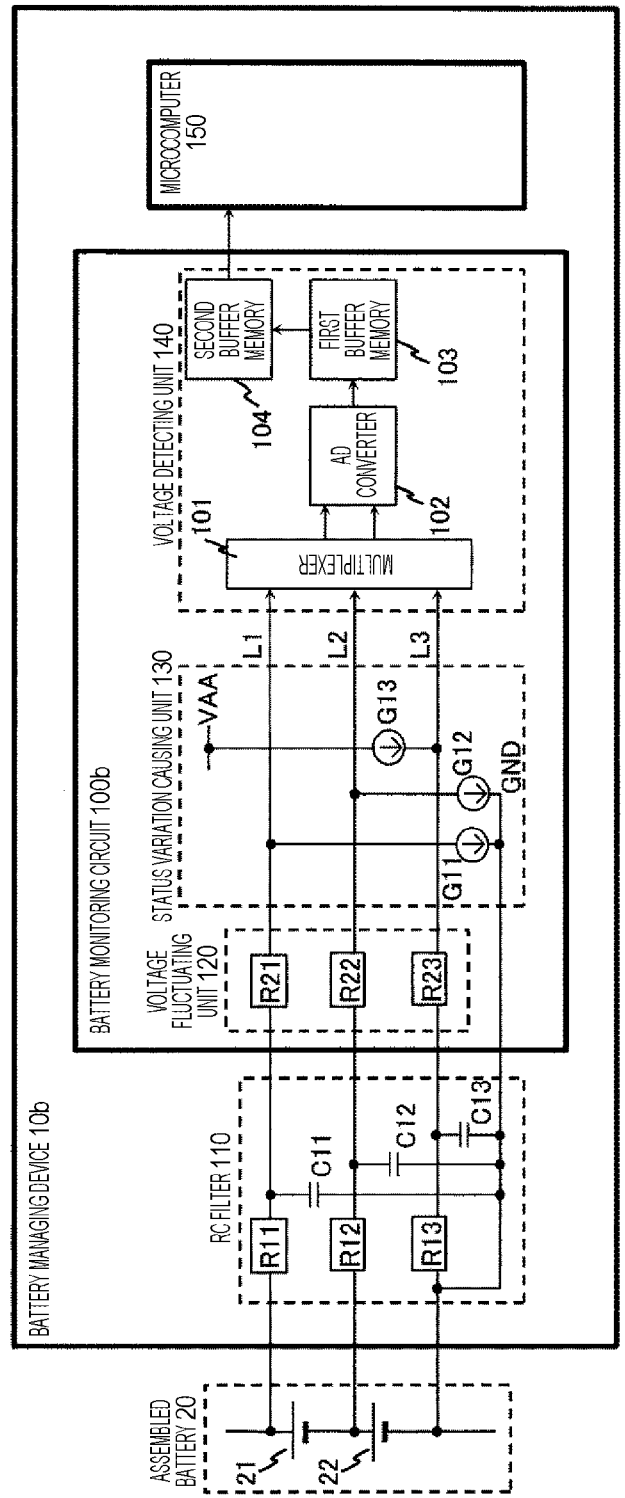
FIG. 7 is a view illustrating a configuration of a battery managing device according to a third embodiment of the invention.

Next, a third embodiment of the invention will be described. FIG. 7 is a view illustrating a configuration of a battery managing device 10b according to a third embodiment of the invention. The battery managing device 10b of this embodiment is different form the battery managing device 10 described in the first embodiment with reference to FIG. 1 in that the voltage fluctuating unit 120 is provided in a battery monitoring circuit 100b. The battery managing device 10b performs the same operation as in the battery managing device 10.

According to the above-described third embodiment of the invention, the battery monitoring circuit 100b includes the voltage fluctuating unit 120, the status variation causing unit 130, and the voltage detecting unit 140. When using the battery monitoring circuit 100b is used in combination with the RC filter 110 and the microcomputer 150, it is possible to exhibit the same operational effect as in the first embodiment.

—Fourth Embodiment—

Figure 8:
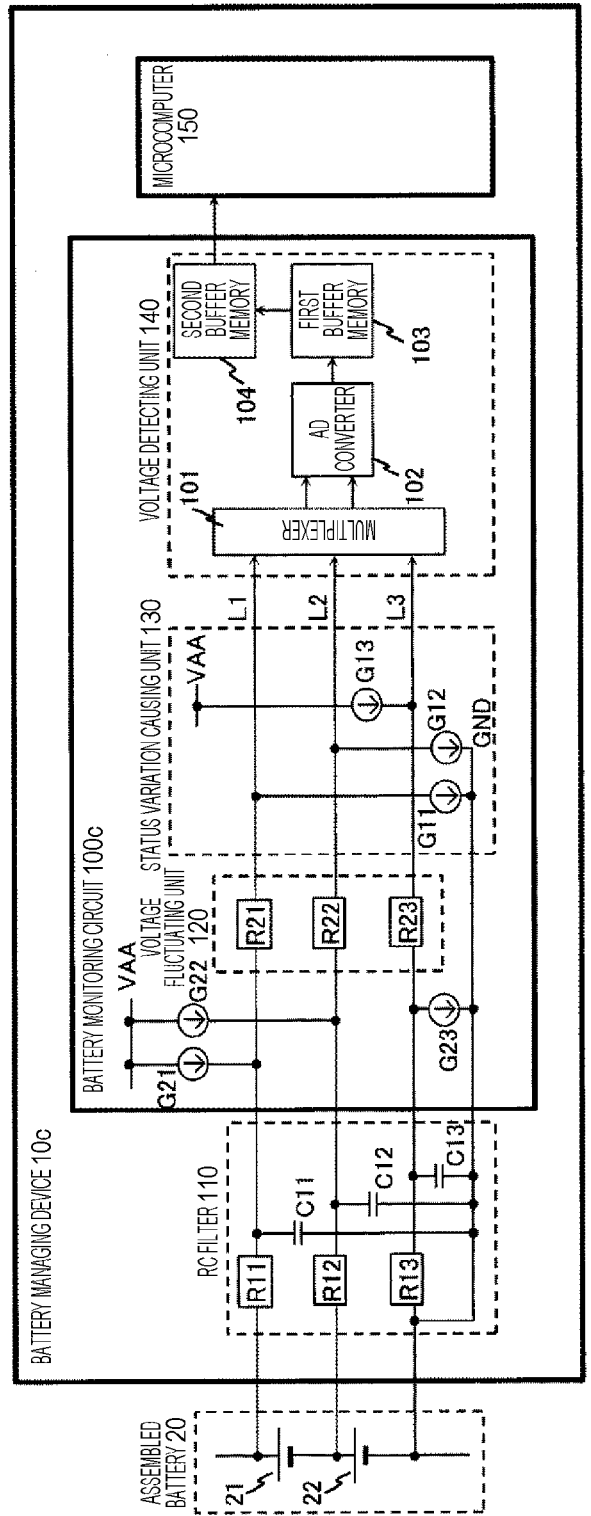
FIG. 8 is a view illustrating a configuration of a battery managing device according to a fourth embodiment of the invention.

Next, a fourth embodiment of the invention will be described. FIG. 8 is a view illustrating a configuration of a battery managing device 10c according to the fourth embodiment of the invention. The battery managing device 10c of this embodiment is different from the battery managing device 10a described in the second embodiment with reference to FIG. 5 in that the voltage fluctuating unit 120 and the current sources G21, G22, and G23 are provided in a battery monitoring circuit 100c. The battery managing device 10c performs the same operation as in the battery managing device 10a.

According to the above-described fourth embodiment of the invention, the battery monitoring circuit 100c includes the voltage fluctuating unit 120, the current sources G21, G22, and G23, the status variation causing unit 130, and the voltage detecting unit 140. When using the battery monitoring circuit 100c is used in combination with the RC filter 110 and the microcomputer 150, it is possible to exhibit the same operational effect as in the second embodiment.

—Fifth Embodiment—

Next, a fifth embodiment of the invention will be described. In this embodiment, description will be given of a control system that uses the battery managing device described in the first to fourth embodiments.

Figure 9:
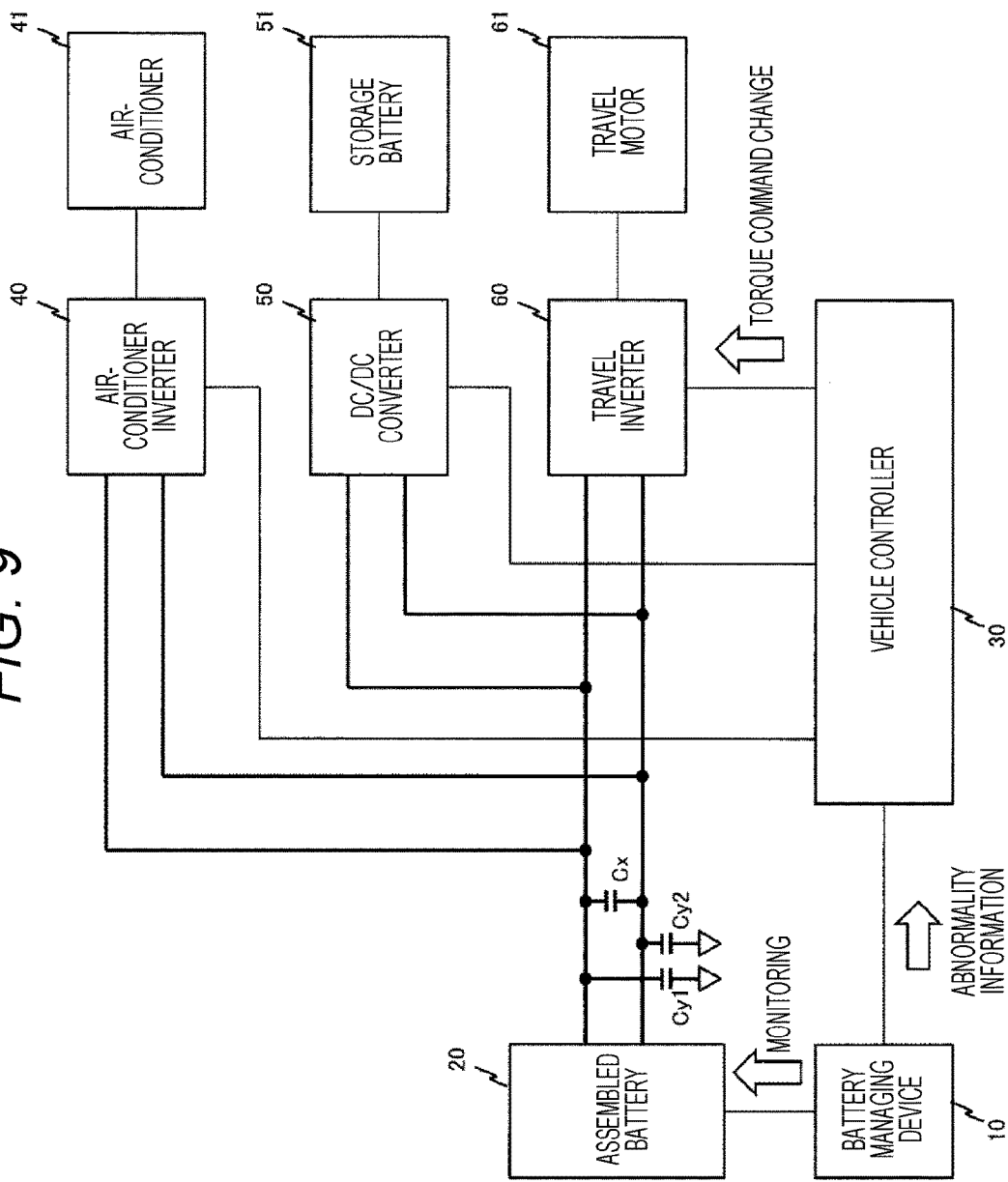
FIG. 9 is a view illustrating a configuration of a control system according to a fifth embodiment of the invention.

FIG. 9 is a view illustrating a configuration of a control system according to the fifth embodiment of the invention. The control system in FIG. 9 is mounted on a vehicle, and includes a battery managing device 10, an assembled battery 20, a vehicle controller 30, an air-conditioner inverter 40, a DC/DC converter 50, and a travel inverter 60. The battery managing device 10 and the assembled battery 20 are the same as those described in the first embodiment. Furthermore, in FIG. 9, the battery managing device 10 is described, but the control system of this embodiment may be constituted by substituting the battery managing device 10 with anyone of the battery managing devices 10a, 10b, and 10c which are respectively described in the second to fourth embodiment.

The vehicle controller 30 is connected to the air-conditioner inverter 40, the DC/DC converter 50, and the travel inverter 60, and performs a control of various apparatuses mounted on a vehicle. The vehicle controller 30 is also connected to the battery managing device 10, and functions as a higher controller of the battery managing device 10.

The air-conditioner inverter 40 converts DC power supplied from the assembled battery 20 into AC power and outputs the AC power to an air-conditioner 41 in accordance with a control of the vehicle controller 30. The air-conditioner 41 operates a compressor (not illustrated) by using the AC power output from the air-conditioner inverter 40 so as to perform an air-conditioning control inside the vehicle.

The DC/DC converter 50 converts a voltage of DC power supplied from the assembled battery 20 into a desired voltage and outputs the voltage to a storage battery 51 in accordance with a control of the vehicle controller 30. The storage battery 51 stores the DC power output from the DC/DC converter 50, and supplies the power to various kinds of electrical equipment of the vehicle as necessary. In addition, the output power from the storage battery 51 may be subjected to voltage conversion by the DC/DC converter 50 and may be output to the assembled battery 20 in a manner opposite to the above-described manner.

In accordance with a control of the vehicle controller 30, the travel inverter 60 converts DC power supplied from the assembled battery 20 into AC power, and outputs the AC power to a travel motor 61 to perform a drive control of the travel motor 61. The travel motor 61 is driven by using the AC power output from the travel inverter 60, and supplies a driving force to drive wheels of the vehicle to allow the vehicle to travel.

Furthermore, an X-capacitor Cx and Y-capacitors Cy1 and Cy2 are provided between the assembled battery 20, and the air-conditioner inverter 40, the DC/DC converter 50, and the travel inverter 60. The X-capacitor Cx mainly removes normal mode noise, and the Y-capacitors Cy1 and Cy2 mainly remove common mode noise.

In the control system of this embodiment, the battery managing device 10 performs monitoring and management of the assembled battery 20 as described in the first embodiment. At this time, the battery managing device 10 measures the terminal voltage of each of the battery cells 21 and 22 which constitute the assembled battery 20, and diagnoses whether or not each of the battery cells 21 and 22, and the voltage detecting unit 140 is abnormal on the basis of the measurement result. As a result, in a case where at least one of the battery cells 21 and 22, and the voltage detecting unit 140 is diagnosed as abnormal, a signal, which indicates the diagnosis result, is output to the vehicle controller 30 as abnormality information related to the abnormality.

When receiving the abnormality information output from the battery managing device 10 as described above, the vehicle controller 30 changes a torque command, which is output to the travel inverter 60, on the basis of the abnormality information. According to this, a control of limiting power supply from the assembled battery 20 is performed with respect to the travel inverter 60. At this time, the torque command, which is output, is switched as follows in correspondence with the content of abnormality indicated by the abnormality information.

In a case where at least one of the battery cells 21 and 22 is diagnosed as abnormal in the battery managing device 10, and abnormality information indicating the diagnosis result is received from the battery managing device 10, the vehicle controller 30 outputs a torque command for setting output torque of the travel motor 61 to zero to the travel inverter 60. According to this, the vehicle controller 30 limits power supply from the assembled battery 20 to the travel inverter 60 so as to completely shut off the power supply, and controls the travel inverter 60 to stop driving of the travel motor 61. That is, in this case, in a state in which the assembled battery 20 is abnormal, if a vehicle travels continuously as is, it may reach a dangerous state, and thus the travel inverter 60 is controlled to immediately stop the travel motor 61.

On the other hand, in a case where the voltage detecting unit 140 is diagnosed as abnormal in the battery managing device 10, and abnormality information indicating the diagnosis result is received from the battery managing device 10, the vehicle controller 30 outputs a torque command for setting output torque of the travel motor 61 to a predetermined value or less to the travel inverter 60. According to this, the vehicle controller 30 controls the travel inverter 60 so that the travel motor 61 is driven to allow the vehicle to continuously travel to a certain extent while limiting power supply from the assembled battery 20 to the travel inverter 60. That is, in this case, the assembled battery 20 is normal, and thus limitation of the power supply from the assembled battery 20 is further mitigated in comparison to a case where the assembled battery 20 is abnormal as described above. According to this, the travel inverter 60 is controlled so that a user can move the vehicle to a repair shop and the like in a self-traveling manner while reducing output of the travel motor 61 to a certain extent not reaching a dangerous state.

The control system according to the fifth embodiment of the invention includes the battery managing device 10, the travel inverter 60 that performs a drive control of the travel motor 61 that allows a vehicle to travel by using power supplied from the assembled battery 20, and the vehicle controller 30 that controls the travel inverter 60. In the control system, in a case where at least one of the battery cells 21 and 22 or the voltage detecting unit 140 is diagnosed as abnormal, the battery managing device 10 outputs abnormality information related to the abnormality to the vehicle controller 30. The vehicle controller 30 performs a control of limiting power supply from the assembled battery 20 with respect to the travel inverter 60 on the basis of the abnormality information output from the battery managing device 10. In the control, in a case where the voltage detecting unit 140 is abnormal, the vehicle controller 30 further mitigates the limitation on the power supply from the assembled battery 20 in comparison to a case where at least one of the battery cells 21 and 22 is abnormal. According to this configuration, it is possible to provide a control system that is safe and easy to use by using the battery managing device 10.

—Sixth Embodiment—

Next, a sixth embodiment of the invention will be described. In this embodiment, description will be given of an example in which a control is performed in consideration of noise resistance in the same control system as described in the fifth embodiment.

Figure 10:
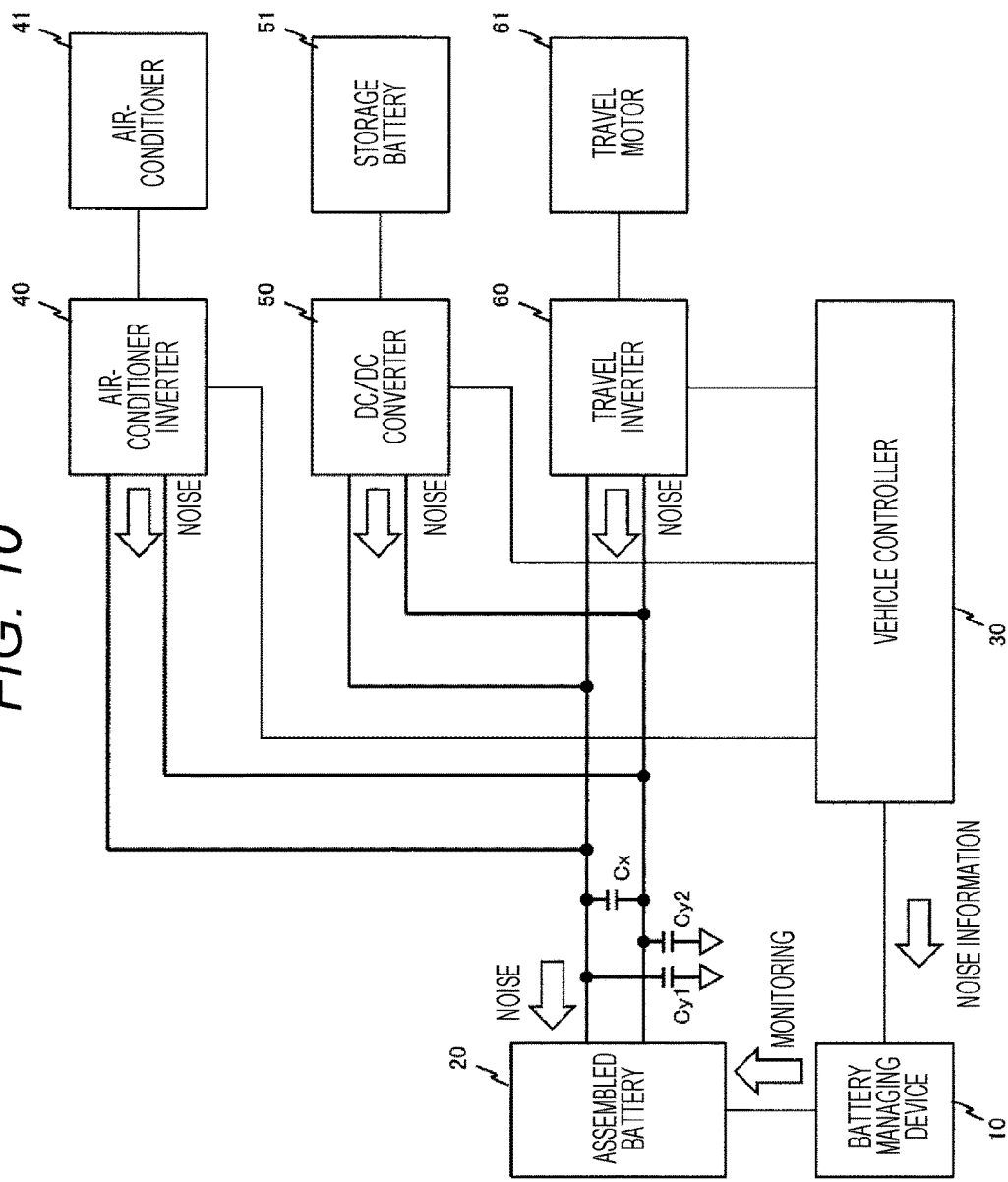
FIG. 10 is a view illustrating a configuration of a control system according to a sixth embodiment of the invention.

FIG. 10 is a view illustrating a configuration of a control system according to the sixth embodiment of the invention. As is the case with the control system according to the fifth embodiment as illustrated in FIG. 9, the control system of FIG. 10 is mounted on a vehicle, and includes a battery managing device 10, an assembled battery 20, a vehicle controller 30, an air-conditioner inverter 40, a DC/DC converter 50, and a travel inverter 60. In addition, in FIG. 10, the battery managing device 10 is described, but the control system of this embodiment may be constituted by substituting the battery managing device 10 with any one of the battery managing devices 10a, 10b, and 10c which are respectively described in the second to the fourth embodiment.

In FIG. 10, each of the air-conditioner inverter 40, the DC/DC converter 50, and the travel inverter 60 outputs noise corresponding to an operation state thereof to the assembled battery 20. According to this, when the noise that is input from each of the devices to the assembled battery 20 is excessive, even when the battery managing device 10 measures the terminal voltage of the battery cells 21 and 22, a correct measurement value may not be obtained. In this case, when performing abnormality diagnosis as described above on the basis of the measurement value of the terminal voltage, there is a possibility that an erroneous diagnosis result may be driven. Therefore, in the control system of this embodiment, in a situation in which the excessive noise is input to the assembled battery 20, the abnormality diagnosis by the battery managing device 10 or detection of the terminal voltage of the battery cells 21 and 22 are invalidated on the basis of noise information that is output from the vehicle controller 30. This configuration will be described below in detail.

In this embodiment, the vehicle controller 30 estimates output noise of each of the air-conditioner inverter 40, the DC/DC converter 50, and the travel inverter 60 in correspondence with an operation state thereof. For example, in the case of the travel inverter 60, it can be estimated that output noise from the travel inverter 60 to the assembled battery 20 increases when the operation amount of an accelerator of a vehicle varies, at the time of a low temperature, at the time of changing a carrier frequency in an inverter control, when a torque variation is great in a low-speed travel, and the like. In addition, for example, in the case of the DC/DC converter 50, it can be estimated that output noise from the DC/DC converter 50 to the assembled battery 20 increases at the time of a low temperature, when a charging and discharging current of the storage battery 51 is in the vicinity of 0 A, and the like. In addition to this, it is possible to estimate the magnitude of the output noise from each device of the air-conditioner inverter 40, the DC/DC converter 50, and the travel inverter 60 to the assembled battery 20 by using various determination conditions. When the output noise is estimated in this manner, the vehicle controller 30 outputs noise information related to the estimation result to the battery managing device 10.

The battery managing device 10 performs monitoring and managing of the assembled battery 20 as described in the first embodiment. At this time, the battery managing device 10 invalidates diagnosis on the voltage detecting unit 140 by the microcomputer 150 or detection of the terminal voltage of the battery cells 21 and 22 by the voltage detecting unit 140 on the basis of noise information output from the vehicle controller 30. Specifically, in a case where a noise magnitude indicated by the noise information is equal to or greater than a predetermined value, in a case where superimposition of noise from a plurality of devices occurs, and the like, the battery managing device 10 does not perform diagnosis on the voltage detecting unit 140 or detection of the terminal voltage of the battery cells 21 and 22. Furthermore, one or both of the diagnosis and the detection may be invalidated.

The control system according to the sixth embodiment described above includes the vehicle controller 30 that performs a control of each of devices including the battery managing device 10, the air-conditioner inverter 40 that uses power supplied from the assembled battery 20, the DC/DC converter 50, and the travel inverter 60. In the control system, the vehicle controller 30 outputs noise information, which relates to noise output to the assembled battery 20 from each of the devices, to the battery managing device 10. The battery managing device 10 invalidates diagnosis on the voltage detecting unit 140 by the microcomputer 150, and/or detection of the terminal voltage of the battery cells 21 and 22 by the voltage detecting unit 140 on the basis of the noise information. According to this configuration, it is possible to provide a control system excellent in noise resistance by using the battery managing device 10.

Furthermore, in the above-described sixth embodiment of the invention, the processing of invalidating diagnosis on the voltage detecting unit 140 and/or a detection result of the terminal voltage of the battery cells 21 and 22 by the voltage detecting unit 140 may be performed on the vehicle controller 30 side. That is, the vehicle controller 30 may estimate nose output to the assembled battery 20 from each of the devices including the air-conditioner inverter 40, the DC/DC converter 50, and the travel inverter 60, and may invalidate the diagnosis result on the voltage detecting unit 140 and/or the detection result of the terminal voltage of the battery cells 21 and 22 on the basis of the estimation result, the results being output from the battery managing device 10. Even in this case, the above-described operational effect can be exhibited. In this case, the vehicle controller 30 may not output noise information to the battery managing device 10.

In addition, the control systems described in the fifth and sixth embodiments maybe applied to a system other than the control system mounted on a vehicle.

In the above-described first to sixth embodiments, the voltage fluctuating unit 120 is constituted by using the diagnosis resistors R21, R22, and R23, and the status variation causing unit 130 is constituted by using the current source G11, G12, and G13. However, the voltage fluctuating unit 120 and the status variation causing unit 130 may be constituted by other constituent elements. For example, the voltage fluctuating unit 120 may be constituted by using a diode, or the status variation causing unit 130 may be constituted by using a voltage source. Any constituent element may be used as the status variation causing unit 130 as long as the electrical status variation is caused with respect to each of the voltage detecting lines. In addition, any constituent element maybe used as the voltage fluctuating unit 120 as long as the terminal voltage, which is measured through each of the voltage detecting lines, of the battery cell is fluctuated in response to the electrical status variation caused by the status variation causing unit 130.

The above-described embodiments or modification examples are illustrative only, and the invention is not limited to the contents of the embodiments or the modification examples as long as characteristics of the invention do not deteriorate.

REFERENCE SIGNS LIST

10, 10a, 10b, 10c, 10h battery managing device
20 assembled battery
21, 22 battery cell
30 vehicle controller
40 inverter for air-conditioner
50 DC/DC converter
60 travel inverter
100, 100b, 100c battery monitoring circuit
101 multiplexer
102 AD converter
103 first buffer memory
104 second buffer memory
110 RC filter
120 voltage fluctuating unit
130 status variation causing unit
140, 140h voltage detecting unit
150 microcomputer

The invention claimed is:

1. A battery managing device comprising:
a voltage detecting unit that is electrically connected to both electrodes of a plurality of battery cells through voltage detecting lines, and detects a terminal voltage of each of the plurality of battery cells;
a filter circuit that is electrically connected to the voltage detecting lines;
a status variation causing unit that causes an electrical status variation with respect to the voltage detecting lines;
a voltage fluctuating unit that is electrically connected to the voltage detecting lines between the filter circuit and the voltage detecting unit, and fluctuates the terminal voltage in response to the electrical status variation that is caused by the status variation causing unit; and
a diagnosing unit that diagnoses the voltage detecting unit on the basis of a detection result of the terminal voltage by the voltage detecting unit when the terminal voltage is fluctuated by the voltage fluctuating unit,
wherein the voltage fluctuating unit includes a resistor, and
the status variation causing unit includes a current source that is disposed on both ends of the resistor, and allows a current output from the current source to flow through the voltage detecting lines so as to cause the electrical status variation.

2. The battery managing device according to claim 1,
wherein when fluctuating the terminal voltage by the voltage fluctuating unit, in a case where a voltage variation in the detection result of the terminal voltage is less than a predetermined threshold value, the diagnosing unit diagnoses that the voltage detecting unit is abnormal.

3. The battery managing device according to claim 2,
wherein the threshold value is determined on the basis of a resistance value of the resistor, and a magnitude of the current that is output from the current source.

4. The battery managing device according to claim 1,
wherein the voltage detecting unit includes a first storage unit and a second storage unit which store the detection result of the terminal voltage.

5. The battery managing device according to claim 4,
wherein the voltage detecting unit stores the terminal voltage when the status variation causing unit causes the electrical status variation in the first storage unit, and stores the terminal voltage when the status variation causing unit does not cause the electrical status variation in the second storage unit, and
the diagnosing unit fetches the terminal voltage, which is stored in each of the first storage unit and the second storage unit, from the voltage detecting unit, and diagnoses the voltage detecting unit on the basis of the terminal voltage that is fetched.

6. A control system comprising:
the battery managing device according to claim 1;
a travel inverter that performs a drive control of a travel motor that allows a vehicle, on which the battery managing device is mounted, to travel by using power supplied from an assembled battery including the plurality of battery cells; and
a vehicle control device that controls the travel inverter,
wherein in a case where it is diagnosed that at least any one of the plurality of battery cells, or the voltage detecting unit is abnormal, the battery managing device outputs abnormality information related to the abnormality to the vehicle control device,
the vehicle control device performs a control of limiting power supply from the assembled battery with respect to the travel inverter on the basis of the abnormality information, and
in a case where the voltage detecting unit is abnormal in comparison to a case where at least one of the plurality battery cells is abnormal, in the control, the vehicle control device mitigates limitation to the power supply from the assembled battery.

7. A control system comprising:
the battery managing device according to claim 1; and
a control device that performs a control of an apparatus that uses power supplied from an assembled battery including the plurality of battery cells,
wherein the control device outputs noise information, which relates to noise output from the apparatus to the assembled battery, to the battery managing device, and
the battery managing device invalidates diagnosis on the voltage detecting unit by the diagnosing unit and/or detection of the terminal voltage by the voltage detecting unit on the basis of the noise information.

8. A control system comprising:
the battery managing device according to claim 1; and
a control device that performs a control of an apparatus that uses power supplied from an assembled battery including the plurality of battery cells, wherein the control device estimates noise that is output from the apparatus to the assembled battery, and invalidates a diagnosis result of the voltage detecting unit and/or a detection result of the terminal voltage, which are output from the battery managing device, on the basis of the estimation result.

* * * * *